United States Patent [19]

Thakoor et al.

[11] Patent Number: 4,726,890
[45] Date of Patent: Feb. 23, 1988

[54] METHOD OF PRODUCING HIGH $T_c$ SUPERCONDUCTING NBN FILMS

[75] Inventors: Sarita Thakoor, Pasadena; James L. Lamb, Los Angeles; Anilkumar P. Thakoor; Satish K. Khanna, both of Pasadena, all of Calif.

[73] Assignee: The United States of America as represented by the Administrator of the National Aeronautics and Space Administration, Washington, D.C.

[21] Appl. No.: 764,812

[22] Filed: Aug. 12, 1985

[51] Int. Cl.[4] .............................. C23C 14/34
[52] U.S. Cl. .......................... 204/192.24; 204/192.15
[58] Field of Search ......... 204/192 R, 192 C, 192 SP, 204/192 S, 192.15, 192.24

[56] References Cited

U.S. PATENT DOCUMENTS

| | | | |
|---|---|---|---|
| 3,616,450 | 10/1971 | Clark | 204/298 |
| 3,711,398 | 2/1971 | Clarke | 204/298 |
| 3,912,612 | 10/1975 | Gavaler et al. | 204/192 |
| 3,988,178 | 10/1976 | Dahlgren | 148/133 |
| 4,046,660 | 9/1977 | Fraser | 204/192 |
| 4,279,969 | 7/1981 | Francavilla et al. | 204/192 S X |
| 4,426,268 | 1/1984 | Cukauskas | 204/192 |
| 4,439,269 | 3/1984 | Cukauska | 204/192 S X |

OTHER PUBLICATIONS

E. J. Cukauskas, "The Effects of Methane in the Deposition of Superconducting Niobium Nitride Thin Films at Ambient Substrate Temperature," J. Appl. Phys., 54(2), Feb. 1983, pp. 1013-1017.

E. J. Cukauskas et al., "Superconducting and Structure Properties of Niobium Nitride Prepared by RF Magnetron Sputtering," J. Appl. Phys., 57(7), 1 Apr. 1985, pp. 2538-2542.

Bacon et al., "Properties of... Substrates", J. of Appl. Phys., 54(11), 11/83, pp. 6509-6516.

Wolf et al., "Effects of... NbN Films", J. Vac. Sci. Technol., 17(1), Jan./Feb. 1980, pp. 411-414.

Akune et al., "NbN Films... Sputtering", Jap. J. of Appl. Phys., vol. 21, No. 5, 5/82, pp. 772-775.

Primary Examiner—John F. Niebling
Assistant Examiner—Nam X. Nguyen
Attorney, Agent, or Firm—Paul F. McCaul; John R. Manning; Thomas H. Jones

[57] ABSTRACT

Thin films of niobium nitride with high superconducting temperature ($T_c$) of 15.7° K. are deposited on substrates held at room temperature ($\sim$90° C.) by heat sink throughout the sputtering process. Films deposited at $P_{Ar} > 12.9 \pm 0.2$ mTorr exhibit higher $T_c$ with increasing $P_{N2,I}$, with the highest $T_c$ achieved at $P_{N2,I} = 3.7 \pm 0.2$ mTorr and total sputtering pressure $P_{tot} = 16.6 \pm 0.4$. Further increase of $N_2$ injection starts decreasing $T_c$.

6 Claims, 7 Drawing Figures

METHOD OF PRODUCING HIGH $T_c$ SUPERCONDUCTING NBN FILMS

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates to a method of producing niobium nitride (NbN) films of high superconducting transition temperature ($T_c$) by dc reactive magnetron sputtering, and more particularly for producing such films on a substrate maintained at room temperature.

NbN thin films are important for a variety of applications due to their high superconducting transition temperature, and their robust refractory nature. They have been used as coatings on carbon fibers for superconducting cables, for superconducting magnets utilizing tape windings [R. T. Kampwirth, et al. ibid., 498 (1985)], and to form superconductor-insulator-superconductor (SIS) tunnel junctions for Josephson device applications [J. C. Villegier, et al., ibid., 498 (1985), E. J. Cukauskas, et al., ibid., 505 (1985), R. B. VanDover, et al., Appl. Phy. Letters 41, 764 (1982)]. Recently, superconductor-insulator-superconductor (SIS) junctions have also attracted a great deal of attention because of their potential use as quasi-particle tunneling based quantum mixers in submillimeter wave heterodyne receivers. [T. G. Phillips, et al., Ann. Rev. Astron. Astrophys., 20 285 (1982), J. R. Tucker, Appl. Phys. Lett. 36 477, (1980), K. H. Gundlach, et al., Appl Phys. Lett. 41, 294 (1982)] The presently used, mechanically soft, Pb-based SIS devices degrade on thermal cycling. Moreover, a low superconducting gap parameter ($\sim 1.5$ meV) limits their use to frequency values $\sim 700$ GHz.

Niobium nitride, with its hard refractory nature, offers a potential of stability over repeated thermal cycling, and its high superconducting gap parameter ($\sim 3$ meV) promises an extended frequency range of application up to $\sim 1500$ GHz. [T. H. Geballe, et al., Physics 2, 293 (1966)] predicted an upper limit of 18° K. for stoichiometric NbN. Since then, numerous workers have deposited NbN thin films by a variety of techniques [J. R. Gavaler, et al., J. Vac. Sci. Tech. 6, 177 (1969), Y. M. Shy, et al., J. Appl. Phys. 44, 5539 (1973), Gin-ichiro Oya, et al., J. Vac. Sci. Tech. 7, 644 (1970), S. A. Wolf, et al., ibid, 17 411 (1980), K. S. Keskar, et al., J. Appl. Phys. 45, 3102 (1974), K. Takei, et al., Jpn. J. Appl. Physics 20, 993 (1981), R. T. Kampwirth, et al., IEEE Trans. Magn. Mag-17, 565 (1981)], and have obtained $T_c$ values in a range of 15°-17° K. using high substrate temperatures ($\geqq 500°$ C.). However, for the ease of device fabrication, it is of extreme importance to be able to deposit NbN films on substrates held at room temperature. Such a film could then be deposited as a counter electrode in SIS junctions without causing any thermal or mechanical degradation to the underlying delicate tunneling barrier. Another advantage of room temperature deposition of NbN is that the substrate could also be polymeric or coated with photoresist making the films accessible for conventional lithographic techniques of patterning.

The occurrence of superconductivity in transition metal nitrides depends sensitively on their stoichiometry and crystal structure. [L. E. Toth, Transition Metal Carbides and Nitrides, Academic, New York (1971), 217] Reactive magnetron sputtering is one of the most suitable techniques for deposition of such materials with stringent composition/structure requirements. Reactive magnetron sputtering offers an excellent control over the rates and pressure of reactants taking part in the reaction, and thereby the stoichiometry of the product. Moreover, the sputtering gas pressure used in the process enables one to control the film microstructure, purity, and stress density in the films; and absence of the secondary electron bombardment of the substrates allows independent control of the substrate temperature, a critical parameter in the deposition of such materials as NbN.

In addition, due to the high kinetic energy bombardment processes involved in sputter deposition, it is generally quite successful in obtaining metastable phases at relatively low substrate temperatures. D. Bacon, et al., J. Appl. Phys. 54 6509 (1983) have used reactive magnetron sputtering on ambient temperature ($\sim 90°$ C.) substrates to yield $T_c$ values $\sim 14.2°$ K. by optimizing the total sputtering pressure and Ar to $N_2$ ratio. A totally different approach has been taken by some workers, of including methane [E. Cukauskas, J. Appl. Phys. 54 1013 (1983) and U.S. Pat. No. 4,426,268; E. Cukauskas, et al., J. Appl. Phys. 57, 2538 (1985)] or cyanogen [T. L. Francavilla, et al., IEEE Trans Magn. MAG-17, 569 (1981)], in the reactive gas mixture with the intent of introducing carbon to stabilize the desired B1 (fcc, NaCl type) crystal structure. The lowest substrate temperature used in such a process, as reported more recently by E. Cukauskas, et al., J. Appl. Phys. 57, 2538 (1985), has been 200° C.

SUMMARY OF THE INVENTION

In accordance with the present invention, the dc reactive magnetron sputtering of niobium in a reactive gas mixture of high purity Ar and $N_2$ is optimized to yield stoichiometric NbN films, with high $T_c$ onto a substrate held at room temperature by a heat sink or a water cooled substrate holder. Room temperature is about 20 degrees C. as defined in Hackl's Chemical Dictionary, 4th Edition, McGraw-Hill Book Company. These films possess the B1 crystal structure with a (111) texture. In films deposited with argon partial pressure, $P_{Ar}$, greater than $12.9 \pm 0.2$ Torr, increasing nitrogen injection initially improves the orientation in the B1 crystal structure and the $T_c$ of the film. However, beyond a certain threshold the structure distorts into a tetragonal phase with a consequent reduction in $T_c$. The most dominant factors governing the formation of the transition metal nitrides are the relative metal and nitrogen fluxes incident on the substrate. The background argon pressure plays a major role in determining the overall reactive sites and residence times available for the nitrogen. Key parameters for an optimum high $T_c$ ($\sim 15.7°$ K.) NbN film deposited on a substrate held at room temperature are: argon partial pressure ($P_{Ar}$) $12.9 \pm 0.2$ mTorr; nitrogen partial pressure ($P_{N2,i}$) $3.7 \pm 0.2$ mTorr; and total sputtering pressure ($P_{tot}$) $16.6 \pm 0.4$ mTorr. Control of these three parameters eliminates the need for methane or cyanogen to obtain high $T_c$ NbN films, and the advantage is that the substrate can be held at room temperature during the sputtering deposition process.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
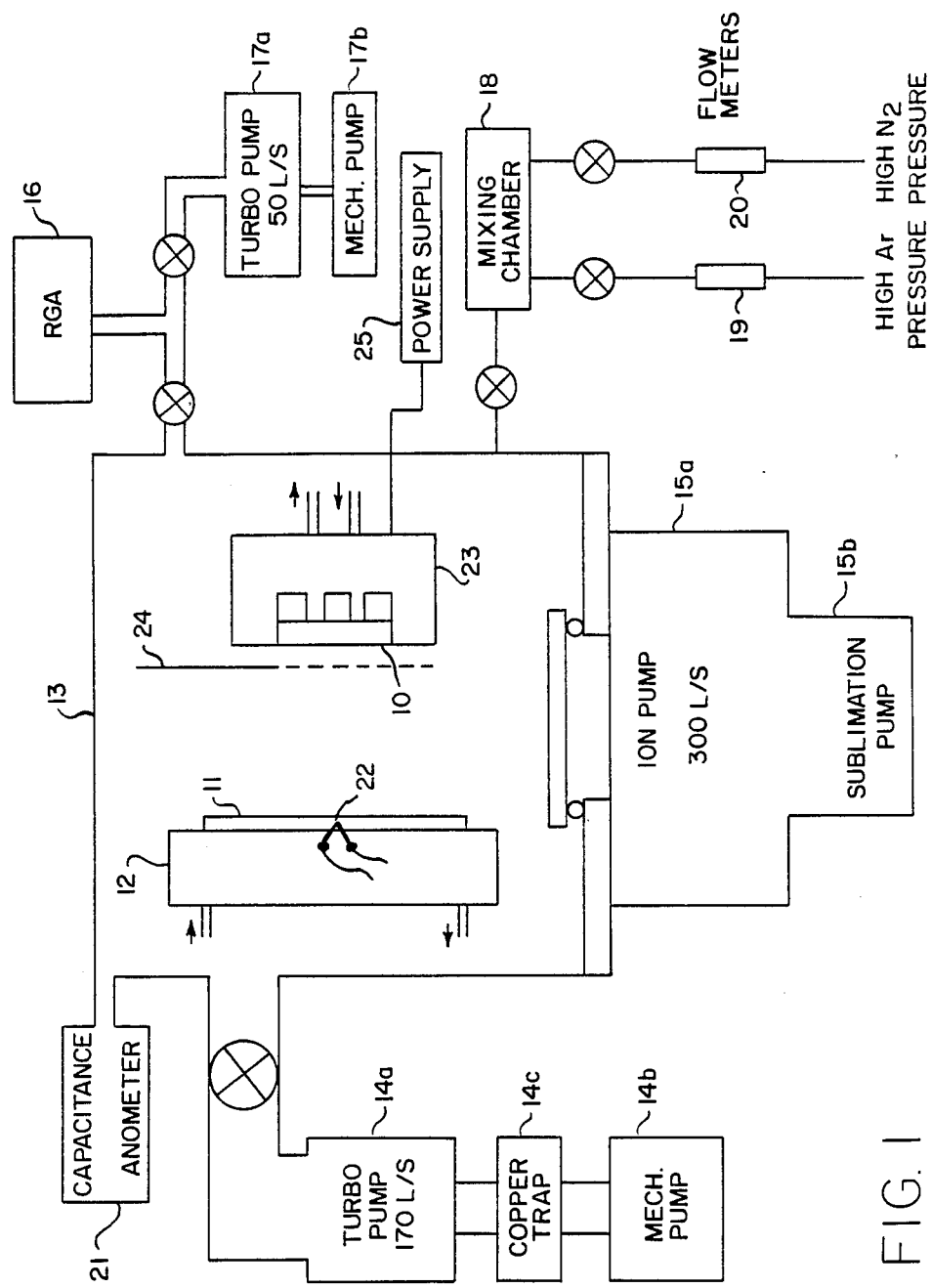
FIG. 1 is a schematic diagram of a conventional dc reactive magnetron sputtering system in which a substrate is held at room temperature.

Referring to FIG. 1, a conventional planar magnetron sputtering system (manufactured by US Inc.) is shown with a 2" diameter, 0.125" thick, 99.91% pure niobium target 10 for depositing NbN films onto a precleaned glass or sapphire substrate 11 fixed on a water cooled substrate holder 12 located $\sim 7$ cm away from the target. An oil-free ultra high vacuum system is used to evacuate a chamber 13 of the sputtering system to a background pressure of $\sim 8 \times 10^{-8}$ Torr. The vacuum system is comprised of a turbo molecular pump 14a backed by a mechanical pump 14b with a copper trap 14c therebetween, which in operation is followed by a 300 liter/sec ion pump 15a supported by a titanium cyrosublimation pump 15b. A differentially pumped residual gas analyzer (RGA) 16 is provided to monitor the system during deposition. The pumping for the RGA is provided by a turbomolecular pump 17a backed by a mechanical pump 17b.

The sputtering is carried out in a reactive gas mixture of high purity (99.999%) argon(Ar) and nitrogen ($N_2$). The flow rates of Ar and $N_2$ into a mixing chamber 18 are independently controlled by their respective flow meters 19 and 20. The pressure in the chamber is monitored by a capacitance manometer 21 (MKS, Type 270 A). Since the primary objective of this invention is to deposit NbN films on substrates maintained at room temperature, a chromelalumel thermocouple 22 is mounted on the substrate 11, or on an adjacent control substrate, to monitor the substrate temperature during sputter deposition. The substrate or substrates are thermally coupled to the substrate holder 12 which is held at room temperature by water cooling during the sputtering process. In that manner, the substrate or substrates are maintained at room temperature. It should be noted that the sputter gun 23 is also water cooled in the customary way.

Typically, an initial background pressure of argon ($P_{Ar}$) is set. A flow of nitrogen is added to obtain the total pressure ($P_{tot}$). The difference between $P_{tot}$ and $P_{Ar}$ gives a measure of the pressure of nitrogen injected ($P_{N2,I}$) under the dynamic equilibrium conditions. The flow of nitrogen is then eliminated and the niobium target 10 is pre-sputtered onto a mechanical shutter 24 for at least two minutes in each run to expose a fresh niobium surface. The variation in $P_{Ar}$ during pre-sputtering is insignificant, indicating that the better pumping speed for Ar due to the Nb flux is negligible as compared to the chamber pumping speed. Subsequently, the pre-set nitrogen flow is reintroduced and a stable plasma is set. In each run, the dc voltage from a power supply 25 is adjusted (320-350 volts) to obtain a constant discharge current ($\sim 1$ Amp). The total pressure of the gases during sputtering ($P_{sp}$) is reduced, indicating the consumption of $N_2$ in the reactive process of NbN formation. After allowing a few minutes for equilibrium to attain, deposition of the film on the substrate is initiated by removing the shutter.

Water cooling of the substrate holder 12 maintains the substrate 11 at room temperature during the entire deposition run. Even in the absence of water cooling, the substrate temperature shows only a small initial increase with time, reaching an equilibrium value, not more than $\sim 90°$ C. in a complete deposition run. Both the flow rates, (varying in the range 2-4 sccm for Ar and 0.3-1 sccm for $N_2$ for the complete set of runs) and chamber pressure were closely monitored during each entire run along with the power applied to the target. Typical values of the voltage, current, and the deposition rate are $-325$ V, 1.0A, and 13.5 Å/sec respectively. Typical film thickness as measured by a surface profilometer is $\sim 5000$ Å.

Following the above procedure, systematic sets of NbN films have been deposited under various partial pressures of argon, ranging from $\sim 5$ mTorr to $\sim 17$ mTorr, mixed in each case with different partial pressures of nitrogen in the range of 2 mTorr to 6 mTorr. The surface of each film was examined with a scanning electron microscope (SEM).

The film resistance as a function of temperature was measured using a four-probe arrangement. A calibrated silicon diode (LakeShore Cryotronics, Westerville, Ohio) was used as a temperature sensor, with a measurement accuracy of $\pm 0.1°$ K. in the 4°-20° K. range. The study of the crystal structure was performed in reflection mode using $CuK\alpha$ radiation on a Siemens Allis D-500 x-ray diffractometer.

Figure 2:
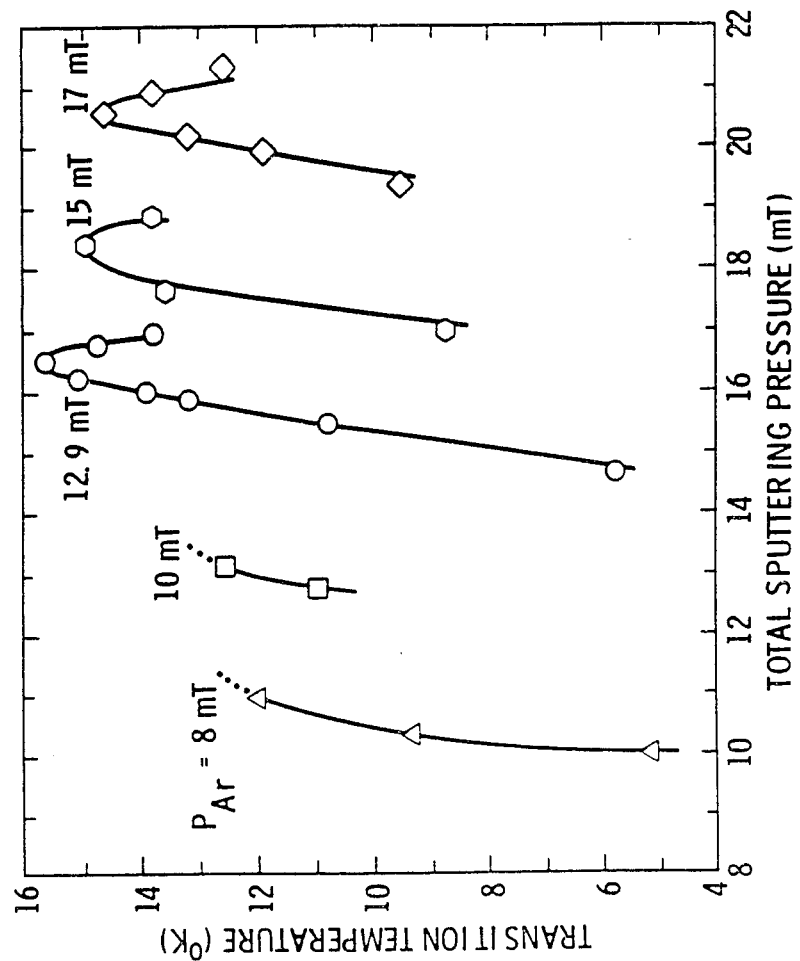
FIG. 2 is a plot of superconducting transition temperature ($T_c$) versus total pressure ($P_{tot}$) for five different partial pressures of argon ($P_{Ar}$).

FIG. 2 shows the dependence of superconducting transition temperature ($T_c$) of the NbN films on the total pressure ($P_{tot}$) for several different partial pressures of argon ($P_{Ar}$) with nitrogen injection pressure ($P_{N2,I}$) varying from 2-5 mTorr in each case. For films deposited at $P_{Ar} \geq 12.9$ mTorr, the $T_c$ increases with increasing $N_2$ injection, reaches a maximum, and starts decreasing again. The films deposited at 12.9 mTorr argon pressure with 3.7 mTorr $N_2$ pressure exhibit the largest $T_c=15.7°$ K. Films deposited with $P_{Ar} \leq 10$ mTorr and $P_{N2,I} \geq 3$ mTorr possessed compressive stresses leading to delamination. SEM study of such films revealed a gradual eruption of stress relief (blister) patterns. Occurrence of such compressive stresses in thin polycrystalline films [D. W. Hoffman, et al., Thin Solid Films, 45, 387 (1977)] deposited by magnetron sputtering at low carrier gas pressure is not unusual. Further enhancement in these stresses prohibited analysis of films deposited at higher nitrogen pressures for these lower $P_{Ar}$ values.

Figure 3:
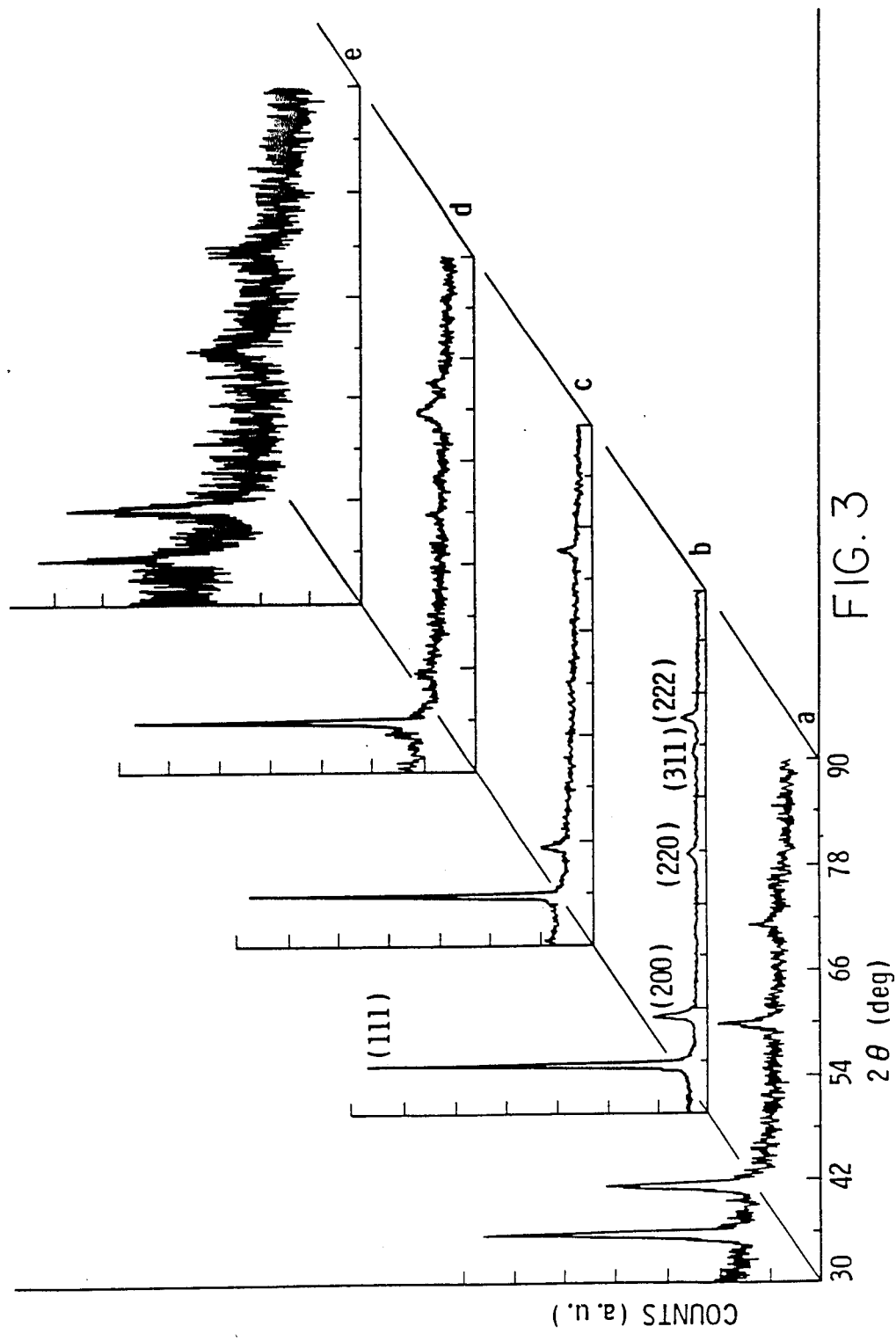
FIG. 3 is a plot of characteristic X-ray diffraction patterns for $P_{Ar}=12$ to 17 mTorr and $P_{N2,I}$ values of (a) 3 mTorr, (b) 3.5 mTorr, (c) 4 mTorr, (d) 4.5 mTorr, and pattern (e) for $P_{Ar} \leq 10$ mTorr, $P_{N2,I} \geq 3$ mTorr.

FIG. 3 presents the x-ray diffraction results. For a fixed high argon partial pressure ($P_{Ar}$:12-17 mTorr), patterns (a) through (d) in FIG. 3 are characteristic of films deposited with $P_{N2,I}$ values of 3, 3.5, 4, and 4.5 mTorr, respectively, whereas pattern (e) is characteristic of a film made at low $P_{Ar}$ values (<10 mTorr) with high nitrogen injection (>3 mTorr). Table I summarizes the observed (d) spacing values and relative line intensities (normalized for the 111 line) for the diffraction patterns shown in FIG. 3. Also listed in the table are the standard values of the B1(fcc, NaCl type) [D. Bacon, et al., supra and G. Brauer and H. Kirner, Z. Anorg. Allg. Chemie. 328, 34 (1964)] and tetragonal [N. Terao, Jpn. J. Appl. Phy. 4, 353 (1965)] crystal structure of NbN, for comparison. The patterns (a) through (d) of FIG. 3 correspond predominantly to the B1 crystal structure. Moreover, a clear trend of increasing intensity ratio of the line (111) with respect to the line (200) is observed as $P_{N2,I}$ is increased (decreasing intensity of line (200) in the plots of patterns a-d which are normalized for the 111 line intensity). To a lesser extent, the intensity ratio of the line (222), second harmonic of (111), to (200) also exhibits a similar increase. In addition, patterns (c) and (d) shows a few more weak lines that correspond to the tetragonal phase of NbN with a progressive increase in their intensities from pattern (c) to (d). Finally pattern (e), which shows maximum noise presumably due to the immense strain in those films, is the most tetragonal rich phase with no specific orientation present.

The films made on amorphous glass substrates and on single crystal sapphire substrates showed identical properties. Irrespective of the substrate used, the crystal structure and texture followed the same behavior which were exclusively dependent on the reactive gas composition and the total pressure.

FIGS. 2 and 3 shows a distinct correlation between the improvement of $T_c$ value and the enhancement in the (111) line intensity, corresponding to the initial increase in nitrogen injection at constant $P_{Ar}$ value. Increase in nitrogen injection pressure beyond a certain threshold however leads to a gradual symmetry modification from the cubic to a tetragonal phase. This is accompanied by a consequent decrease in $T_c$. This shows that the distortion of the B1 structure into the tetragonal phase is detrimental to a high transition temperature. It is known that $T_c$ of the B1 transition metal nitrides is very sensitive to the nitrogen/metal ratio [L. E. Toth, supra]. The B1 phase of $NbN_x$ has been reported [G. Brauer, et al., supra] over a significant stoichiometry range (x=0.85 to x=1.06), with the lattice parameter, a, showing a systematic variation from a=4.375 Å to a=4.395 Å. The highest $T_c$ films indeed exhibit only those diffraction lines which correspond to the B1 structure (e.g., FIG. 3b) and yield a lattice parameter value of 4.38±0.01 Å. The large uncertainty in the lattice parameter is primarily due to the large full width at half maxima (≧0.3°) of the diffraction lines, presumably caused by the grain size distribution and structural imperfections frozen in the films. The enhancement in the (111) line intensity with deposition conditions is primarily due to a strong orientation present in the films with the (111) direction perpendicular to the substrate plane. Variations in the film stoichiometry may also have contributed to some extent to the changes in the relative intensities of the diffraction lines.

It may be mentioned here that films deposited at higher substrate temperatures (~450° C.) reportedly show an enhancement in intensity of the (200) line. A similar observation has been reported by other workers in high temperature deposition with methane or cyanogen inclusion. [T. L. Francavilla, et. al., supra and E. J. Cukauskas, et al., supra]. However, the high temperature deposited films with which the present inventors experimented did not show any improvement in the superconducting transition temperature, and thus the modified reaction and film growth kinetics at higher substrate temperatures is excluded from the scope of this invention.

The electrical resistivity and resistance ratio, $R_{300° K.}/R_{20° K.}$, for the films deposited under $P_{Ar}$>12-mTorr and $P_{N2,I}$>3mTorr which possess predominantly B1 structure are summarized in Table II. The values are comparable to those observed by other workers. [D. Bacon, et al., supra and T. L. Francavilla, et al., supra]. The slight negative temperature coefficient observed in an indication of the degree of disorder in both metal and nonmetal vacancies. [L. E. Toth, supra page 190].

Figure 4:
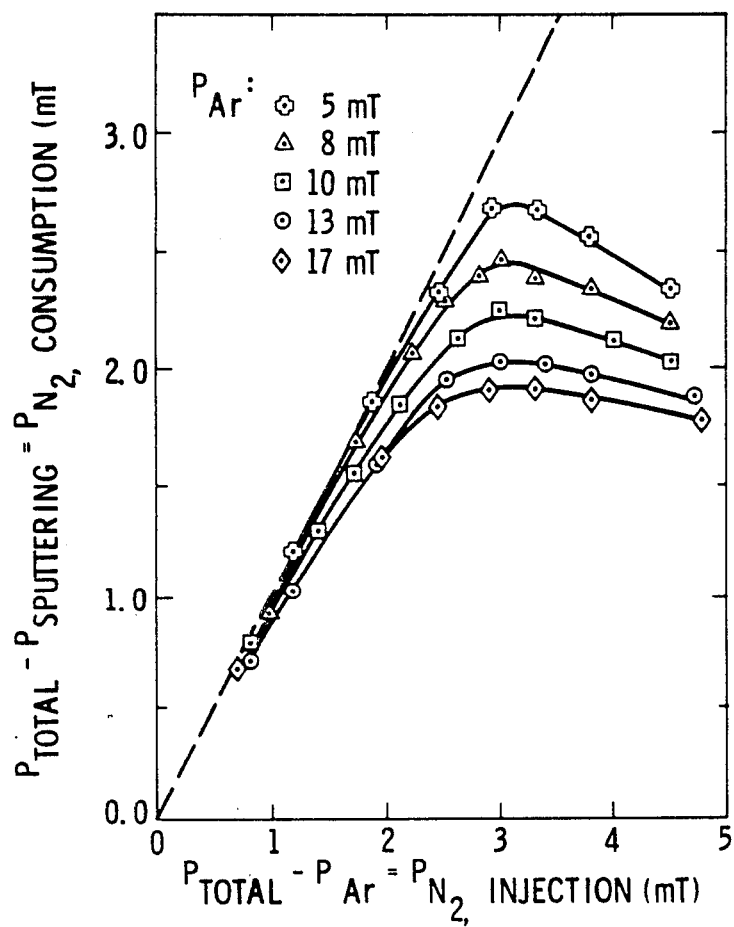
FIG. 4 is a plot of $P_{N2,I}$ versus $P_{N2,C}$ for five different $P_{Ar}$ values ranging from 5 to 17 mTorr. Dashed line represents full consumption of the injected nitrogen, $P_{N2,C}=P_{N2,I}$, where I and C stand for injection and consumption, respectively.

FIG. 4 presents nitrogen consumption, $P_{N2,C}$, (as estimated from the difference of $P_{tot}$ and the pressure during sputtering, $P_{sp}$, i.e., $P_{N2,C}=P_{tot}-P_{sp}$) as a function of $P_{N2,I}$ for $P_{Ar}$ ranging from 5 to 17 mTorr. The dashed line represents $P_{N2,C}=P_{N2,I}$, the hypothetical case of complete consumption of injected nitrogen. Nitridation of the target commences at $P_{N2,I}$~3 mTorr, for $P_{Ar}$=5 mTorr or 8 mTorr, as is indicated by a relatively sharp decrease in consumption with increasing injection. This transition point (deviation from the straight line plot) in the consumption versus injection characteristic is somewhat less abrupt than that commonly observed in the formation of reactively sputter deposited oxides. [Tetsuya Abe, and Toshiro Yamashina, Thin Solid Films, 30, 19 (1975); J. L. Vossen, W. Kern, (Ed.) Thin Film Processes, Academic Press (1978); and J. Heller, Thin Solid Films, 17, 163 (1973)] Two general trends are noticed with increasing $P_{Ar}$ for a fixed $P_{N2,I}$. First, there is a reduction in consumption ($P_{N2,C}$) with increasing $P_{Ar}$. Second, the consumption characteristic at and beyond the transition point becomes a weaker function of $P_{N2,I}$ with increasing $P_{Ar}$.

Clearly, it is possible to deposit the desired B1 structure of NbN substrates maintained at room temperature using magnetron sputtering. Its occurrence as well as crystalline texture evidently depend critically on the flux of reactants, namely Nb and N$_2$, rather than the substrate temperature. In the absence of a direct measure of film stoichiometry or its indirect estimate from the lattice parameter (which has a limited accuracy), only the increasing $T_c$ with initial increase of $P_{N2,I}$ could be taken as an indication of the stoichiometry. Thus, for a film deposited at $P_{Ar}$=12.7 mTorr and $P_{N2}$=3.7 mTorr, exhibiting $T_c$~15.7° K.; $NbN_x$ stoichiometry may have approached to x=1. In addition, the apparent preferred (111) orientation also may be a direct effect of improving stoichiometry (i.e., reduction in non-metal vacancies, increase in nitrogen consumption, $P_{N2,C}$) and a contributory factor to high $T_c$.

The observed behavior at and beyond the transition region in FIG. 3, where the tetragonal phase of NbN makes its appearance, can be understood primarily in terms of the variations in $P_{N2,C}$, since $P_{N2,C}$ may be considered as a direct measure of the amount of $N_2$ actually taking part in the chemical reaction to form $NbN_x$. Such a chemical reaction is influenced by the type and amount of reactant fluxes, as well as the presence of nonreacting species. In the pre-transition region, virtually all of the compound systhesis occurs at the substrate and chamber walls and the stoichiometry of the film depends on the relative rates of arrival of niobium vapor and reactive nitrogen gas onto the deposition surfaces. In this region, the target erosion rate and therefore the Nb incident flux on the substrates and walls is essentially unchanged. $P_{N2,C}$ is therefore largely controlled by $P_{N2,I}$. However, for a fixed $P_{N2,I}$, as $P_{Ar}$ is increased, the ratio $P_{Ar}$ to $P_{N2,I}$ is increased resulting in an increase in the surface impingement rate of argon. These additional Ar atoms on the surface of the substrates and walls can lower the adatom mobility of the nitrogen atoms impinging there, which can reduce both, available reaction sites and the residence time of nitrogen as an adatom, resulting in the small deviation in $P_{N2,C}$ from the straight line ($P_{N2,C}=P_{N2,I}$) behavior.

Figure 5:
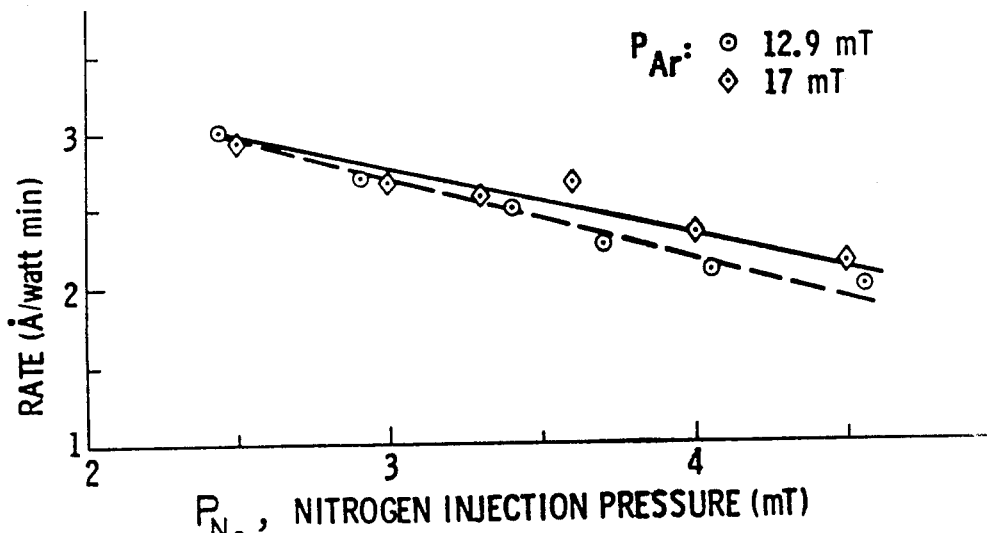
FIG. 5 is a plot of deposition rate versus $P_{N2,I}$ for $P_{Ar}=12.9$ mT and $P_{Ar}=17$ mT. The accuracy of the rate measurement is $\sim \pm 5\%$.

In the post-transition region, the reduction in $P_{N2,C}$ becomes even more pronounced. Here, the reactions occurring on the target as well as the substrate and the wall surface not only influence $P_{N2,C}$, but also change the gas composition significantly. For a fixed Ar pressure, as $N_2$ injection is increased to the point that impingement rate of nitrogen exceeds the flux of sputtered Nb atoms, there is a possibility of target surface nitridation. NbN is conducting in nature ($\sim 150\mu\Omega$), hence no appreciable change in power (V or I or deposition rate as seen in FIG. 5) occurs at the transition. Thus, the incident Nb flux remains largely unchanged, though the sputtered species may include a small fraction of molecular NbN. However, a relatively large reduction in nitrogen consumption does occur at this point. Associated with this reduction in $P_{N2,C}$ is a rise in the partial pressure of $N_2$ and thus its impingement rate. It is this increase in excess $N_2$ which greatly influences the structure in the post-transition region.

During film growth, structural order is produced largely by the surface mobility of the adatoms. In the pre-transition region, the adatom mobility of niobium and nitrogen is large enough, even on the room temperature substrates, to form a well-oriented B1 structure. In the post-transition region, the adatom mobility is reduced by the presence of excess nitrogen incident on the substrate. With increasing $P_{N2,I}$, beyond the transition, continuing the same trend of increasing stoichiometry, the material should be towards super stoichiometry, i.e., $NbN_{1+\Delta}$. It is known that super stoichiometric $NbN_{1+\Delta}$, where $\Delta$ can be as high as 0.06, could be formed but requires a presence of very high pressure ($\sim 240$ atm.) nitrogen ambient and extremely high ($\sim 1200°$) temperatures. [G. Brauer and H. Kirner, Z. Anorg. Allg. Chemie. 328, 34 (1964)] Such a B1 structure then effectively incorporates more nitrogen than Nb atoms, contains metallic vacancies, and exhibits a distinct reduction in lattice constant compared to the stoichiometric NbN. The low pressuer sputtering environment is not expected to be conducive to such a process.

Since the structure cannot incorporate any more nitrogen, an increase in the partial pressure of $N_2$ occurs in the chamber. The resulting increase in the impingement rate of $N_2$ leads to a further reduction in the adatom mobility on the substrate. Vacancy formation then becomes more probable as the structure tends to modify (reduction in lattice constant), and in that process distorts to the tetragonal phase in some regions rejecting a lot more nitrogen. Such vacancy formation may also be promoted by incident molecular fractions which are less free to orient themselves in the direction of a reactive site. Films at this stage exhibit a mixture of B1 and tetragonal phase (Table I). It may also be mentioned here that the metastable B1 phase of NbN is known [N. Terao, Jpn. J. Appl. Phy. 4, 353 (1965)] to distort into tetragonal phase on vacuum annealing.

Figure 6:
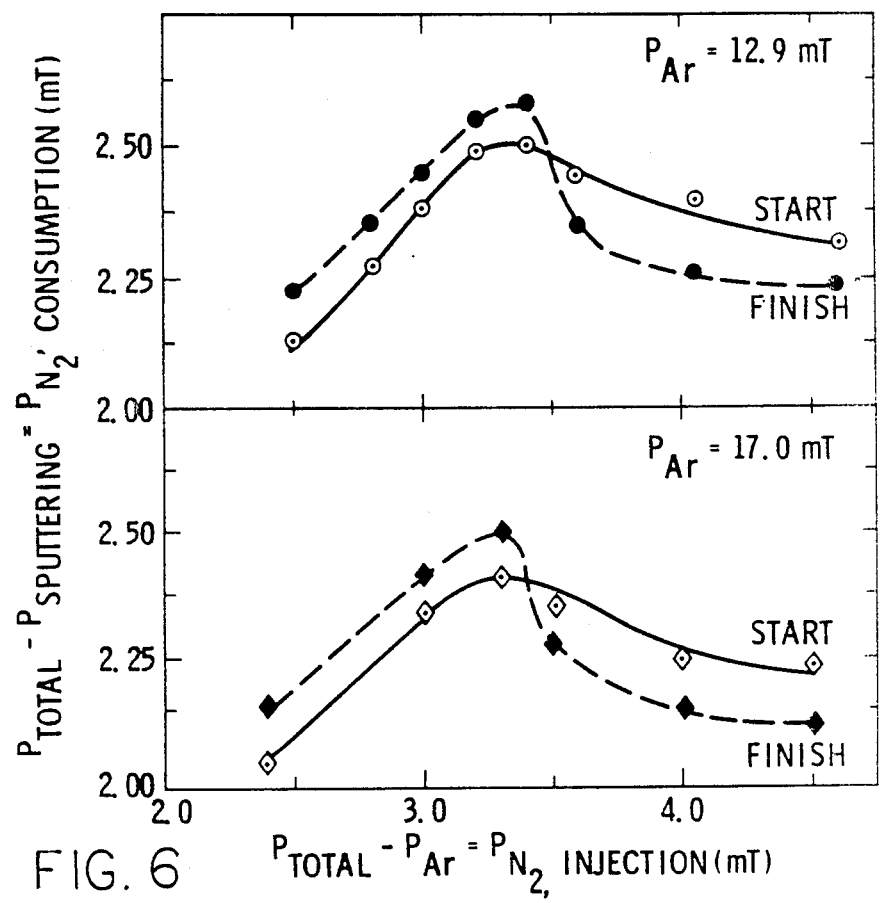
FIG. 6 is a plot of $P_{N2,C}$ versus $P_{N2,I}$ at the start and finish of a deposition under $P_{Ar}=12.9$ mT and $P_{Ar}=17$ mT.

It is a common observation in any reactive magnetron sputtering, particularly with small size targets, that the target erosion rate during one deposition of film itself significantly modifies the overall conditions of dynamic equilibrium. [M. Gurvitch, J. Vac. Sci. Tech. A2, 1550 (1984)] In the present study also, changes in sputtering conditions with time were observed. FIG. 6 shows the variation in nitrogen consumption as a function of injection at the start and at the finish of the deposition, for two different values of $P_{Ar}$, thus giving a complete evolution in the rate of nitrogen consumption during the deposition. Therefore, the present films may have some gradient in their stoichiometry, microstructure, crystal structure, and thereby in the transition temperature, along the thickness. This would manifest itself in the form of a somewhat wide superconducting transition. The high $T_c$ films made at $P_{Ar}=12.9$ mTorr have widths $\sim 0.2°$ K., and the maximum transition widths seen for other films are $\sim 0.5°$ K. Although it is very difficult to estimate the extent of structural or chemical gradients in the films from the observed transition widths, one may expect sharper transitions if films can be made by suitably locking the deposition conditions at the optimum values.

Finally, FIG. 2 suggests another possibility of a further improvement in the film $T_c$. For the same nitrogen injection pressure ($\sim 3.5$ mTorr), FIG. 2 shows that $T_c$ improves with reducing Ar partial pressure. This is, of course, due only to the optimized incidence ratios of Nb, $N_2$, and Ar on the substrate surface as other sputtering conditions are unchanged. The compressive stresses developed in the films, however, do not allow experimental verification of this fact to low Ar pressures ($<10$ mTorr). If the compressive stresses in the film at lower Ar pressure could be suppressed by introduction of an additional suitable deposition parameter such as an application of appropriate substrate bias, $T_c$ may improve even further approaching the predicted value of 18° K. [T. H. Geballe, et al., supra]

Figure 7:
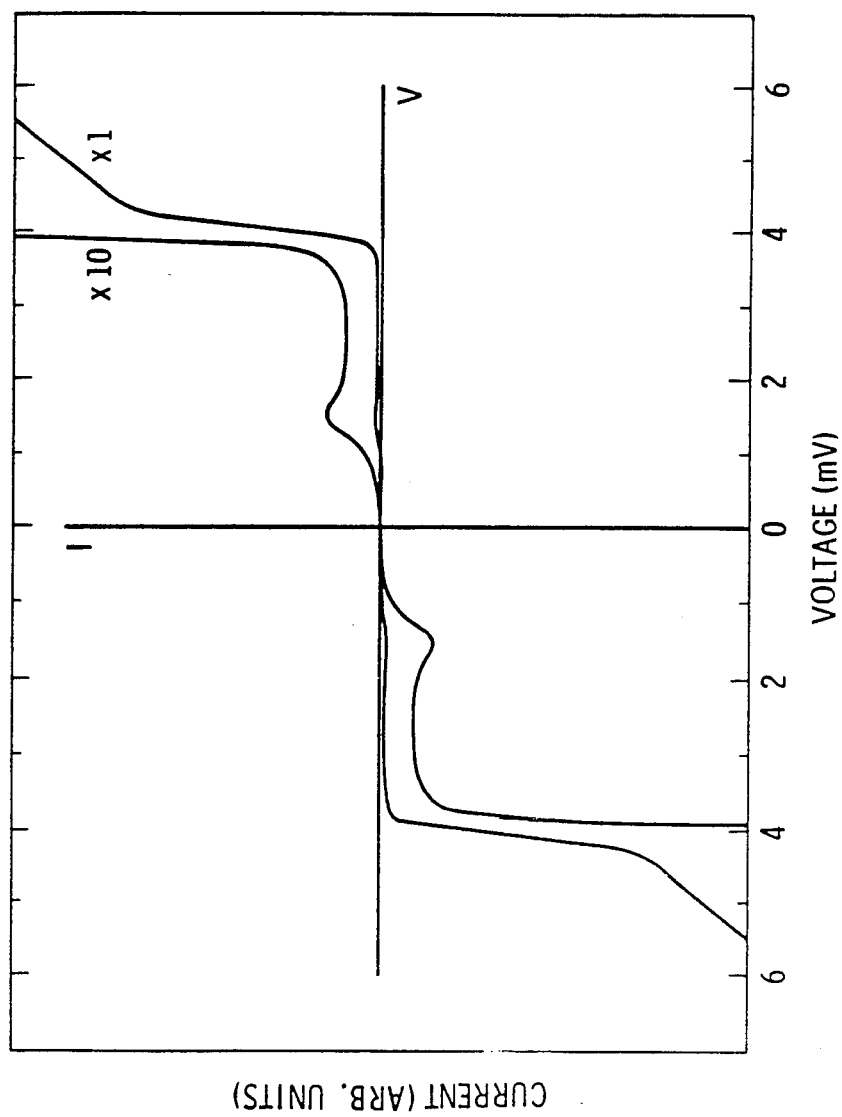
FIG. 7 is a plot of typical current versus voltage (I-V) characteristic for a NbN-Oxide-Pb, SIS junction. The X10 curve is enlarged along the I axis by an order of magnitude to show the fine structure.

SIS tunnel junctions using these high $T_c$ films have been made. The native oxide obtained by room air oxidation or plasma oxidation is used as the tunnel barrier and thermally evaporated pure lead is used as a counter electrode. A typical current versus voltage (I-V) characteristic is shown in FIG. 7. It clearly indicates a uniform, single phase, large superconducting gap NbN material.

Although particular embodiments of the invention have been described and illustrated herein, it is recognized that modifications and variations may readily occur to those skilled in the art. Consequently, it is intended that the claims be interpreted to cover such modifications and variations.

TABLE I

Comparison of standard and observed d spacing values and relative intensity (normalized for 111 line) for the fcc and tetragonal phases of NbN

| Standard d values (Å) | | | | Observed d values (Å) and relative intensity (I) | | | | | | | | | |
|---|---|---|---|---|---|---|---|---|---|---|---|---|---|
| FCC | | Tetragonal | | Sample "a" | | Sample "b" | | Sample "c" | | Sample "d" | | Sample "e" | |
| d,(hkl) | I | d,(hkl) | I | d | I | d | I | d | I | d | I | d | I |
| 2.534(111) | VS | | | 2.53 | 100 | 2.53 | 100 | | | | | | |
| | | 2.518(111) | 100 | | | | | 2.51 | 100 | 2.52 | 100 | 2.51 | 100 |
| 2.194(200) | VS | 2.191(200) | 100 | 2.19 | 60 | 2.19 | 15 | 2.19 | 14 | 2.19 | 21 | 2.19 | 84 |
| | | 2.158(002) | 60 | | | | | 2.15 | 7 | 2.15 | 18 | 2.16 | 78 |
| 1.551(220) | S | 1.551(220) | 40 | 1.55 | 28 | 1.55 | 7 | 1.55 | 6 | 1.55 | 16 | 1.55 | 52 |
| | | 1.538(202) | 60 | | | | | 1.53 | 5.5 | 1.53 | 13 | 1.54 | 54 |
| 1.323(311) | M | 1.321(311) | 20 | 1.32 | 24 | 1.32 | 5 | 1.32 | 5 | 1.32 | 18 | 1.32 | 42 |
| | | 1.303(113) | 20 | | | | | 1.31 | 4.5 | 1.31 | 17 | 1.31 | 47 |
| 1.267(222) | VW | | | 1.26 | 18 | 1.26 | 6 | 1.26 | 7 | 1.26 | 14 | 1.26 | 36 |
| 1.097(400) | VS | | | 1.09 | 14 | 1.09 | 3 | 1.10 | 4 | 1.10 | 9 | 1.10 | 35 |
| 1.007(331) | W | | | 1.00 | 12.5 | 1.01 | 3 | 1.00 | 4 | 1.00 | 9 | — | — |

TABLE II

Electrical resistivity and Resistance Ratio, $\frac{R300° K.}{R20° K.}$, for NbN films with predominatly B1 structure deposited under varying mixtures of $P_{Ar}$ and $P_{N2,I}$ conditions.

| Reactive Gas Mixture | | Resistivity | $\frac{R300° K.}{R20° K.}$ |
|---|---|---|---|
| $P_{Ar}$ (mTorr) | $P_{N2,I}$ (mTorr) | ($\mu \Omega$cm) | |
| 17.0 | 3.0 | 83 | 0.87 |
| 17.0 | 3.3 | 90 | 0.93 |
| 17.0 | 3.6 | 114 | 0.81 |
| 17.0 | 4.0 | 138 | 0.73 |
| 12.9 | 3.4 | 188 | 0.95 |
| 12.9 | 3.7 | 227 | 0.90 |
| 12.9 | 4.1 | 292 | 0.85 |

What is claimed is:

1. A method for forming NbN films having a high $T_c$ in the range of 15° to 16° K. and possessing B1 crystal structure with a (111) texture, without the introduction of carbon or any compound of carbon in any form to obtain the B1 crystal structure and high $T_c$ characteristics, by dc reactive magnetron sputtering niobium on a substrate in a reactive gas mixture of high purity Ar and $N_2$ and a base pressure of $10^{-8}$ Torr comprising the steps of maintaining said substrate at about 20° C. throughout the sputtering process, maintaining the partial pressure $P_{N2,I}$ of reactive gas, $N_2$, constant in a range of 3 to 4 mTorr, maintaining the partial pressure $P_{Ar}$ of the carrier gas, Ar, constant in a range of 12.9 to 17 mTorr, and maintaining the total sputtering pressure constant in a range of 16 to 21 mTorr.

2. A method as defined in claim 1 wherein the dc voltage is set to obtain a constant discharge current of about 1 ampere.

3. A method as defined in claim 2 wherein the surface of the Nb target is precleaned in pure Ar ambient by presputtering the target onto a mechanical shutter which is placed in the sputtering path of said substrate, subsequently after the desired equilibrium of operating parameters is obtained, deposition of the film is initiated by removing the shutter.

4. A method as defined in claim 1 wherein the partial pressure $P_{N2,I}$ of reactive gas injection is maintained at 3.7±0.2 mTorr.

5. A method as defined in claim 4 wherein the partial pressure $P_{ar}$ of the carrier gas is maintained at 12.9±0.2 mTorr.

6. A method as defined in claim 5 wherein the total sputtering pressure is maintained at 16.6±0.4 mTorr.

* * * * *